(12) United States Patent
Foster et al.

(10) Patent No.: US 8,423,934 B1
(45) Date of Patent: Apr. 16, 2013

(54) MODEL VALIDATION COCKPIT

(75) Inventors: Paul C. Foster, Scotts Valley, CA (US);
Tina M. Najibi, San Jose, CA (US);
Walter E. Hartong, Isen (DE); T. Martin O'Leary, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 252 days.

(21) Appl. No.: 12/710,212

(22) Filed: Feb. 22, 2010

(51) Int. Cl.
*G06F 17/50* (2006.01)

(52) U.S. Cl.
USPC ............................................. 716/107

(58) Field of Classification Search .......... 716/100, 716/107
See application file for complete search history.

(56) References Cited

U.S. PATENT DOCUMENTS

| | | | |
|---|---|---|---|
| 6,449,750 B1* | 9/2002 | Tsuchiya | 716/107 |
| 6,959,271 B1* | 10/2005 | Ballam | 703/14 |
| 7,055,118 B1* | 5/2006 | Kamepalli et al. | 716/107 |
| 7,143,376 B1* | 11/2006 | Eccles | 716/136 |
| 7,350,168 B1* | 3/2008 | Mathur et al. | 716/107 |
| 2008/0172640 A1* | 7/2008 | Fenkes et al. | 716/5 |
| 2011/0145772 A1* | 6/2011 | Pikus | 716/112 |

\* cited by examiner

*Primary Examiner* — Suchin Parihar
(74) *Attorney, Agent, or Firm* — Holland & Knight LLP; Mark H. Whittenberger

(57) ABSTRACT

An electronic design automation (EDA) tool to validate representations of a design is disclosed. Reference and compared representations of the design are intended to respond to stimulus in the same way, but at different levels of abstraction. The reference and compared representations are simulated, at some point, to each generate waveform signals and measured results. Simulation can be with the same tool or different tools. The same or different testbench can be used on the reference and compared representations in the simulation. A design representation validation function compares the two sets of generated waveform signals and compares the two sets of measured results to identify any violations. The measured results and/or waveform signals could be loaded from previous simulations and just validated within the validation tool. Loaded simulations could be for the reference representation with just simulation of the compared representation by the validation tool, or for both with no simulations run by the validation tool. Through an optional design representation validation interface, the violations are identified and are linked to interfaces that detail the violations in greater detail, for example, to aid in debugging why the reference and compared representations are not equivalent.

20 Claims, 13 Drawing Sheets

MODEL VALIDATION COCKPIT

BACKGROUND

This disclosure relates in general to electronic design automation and, but not by way of limitation, to design verification at different levels of abstraction.

Circuit design is a complex endeavor involving different electronic design automation (EDA) tools, multiple design engineers, many computers, etc. Design teams may be in different locations or even different companies. EDA tools may not consistently work together or have similar understandings of the underlying designs or representations. Coordination of the design as it evolves is complex and difficult to manage. Testing occurs periodically and debugging errors created with recent changes is difficult.

Designers work at different levels of abstraction in the same design to create abstractions, models or representations. Through a mixture of top-down and bottom-up design, it is common to have multiple representations of the same design. Representations at the different levels of abstraction may be changed serially or in parallel, but in any event, the operation can diverge between the two even though they are meant to represent the same design. For each level of abstraction, there is some ability to validate that the representation is operating correctly. Some verification allows checking measured results such as set-up and hold timing violations and others allow viewing waveform signals to assist manual analysis also known as "eyeballing the waveforms."

SUMMARY

In one embodiment, the present disclosure provides an electronic design automation (EDA) tool to validate different design models, representations or abstractions. A reference and a compared representation of the design are intended to be behaviorally and functionally equivalent, but at different levels of abstraction. By equivalent, what is meant is that the representations respond to stimulus in the same way—beyond function this can include parametric and performance related behavior. The reference and compared representations are simulated, at some point, to each generate waveform signals and measured results. Simulation can be with the same tool or different tools. The same or different testbench can be used on the reference and compared representations in the simulation. A design representation validation function compares the two sets of generated waveform signals and compares the two sets of measured results to identify any violations. The measured results and/or waveform signals could be loaded from previous simulations and just validated within the validation tool. Loaded simulations could be for the reference representation with just simulation of the compared representation by the validation tool, or for both with no simulations run by the validation tool. Through an optional design representation validation interface, the violations are identified and are linked to interfaces that detail the violations in greater detail, for example, to aid in debugging why the reference and compared representations are not equivalent.

In one embodiment, a computer-implemented electronic design automation (EDA) method to validate different design representations is disclosed. A reference and compared representations of a design are loaded. The reference and compared representations are intended to respond to stimulus in the same way. The reference representation is at a different level of abstraction than the compared representation. The reference representation is simulated to generate first waveform signals and first measured results. The compared representation is simulated to generate second waveform signals and second measured results. Identifying waveform signal violations by comparing that the first waveform signals and second waveform signals. Identifying measured result violations by comparing that the first measured results and the second measured results.

In another embodiment, an EDA tool to validate design representations is disclosed. Specifically, a reference representation and a compared representation of a design are validated. The reference and compared representations are intended to respond to stimulus in a same way. The reference representation is at a different level of abstraction than the compared representation. A first simulation instance is configured to generate first waveform signals and first measured results with the reference representation. A second simulation instance is configured to generate second waveform signals and second measured results with the compared representation. A design representation validation function is configured to: compare the first waveform signals and second waveform signals to identify waveform signal violations, and compare the first measured results and the second measured results to identify measured result violations.

In yet another embodiment, a machine-readable medium that executes on a processor to validate design representations is disclosed. The machine readable media comprising code for: loading a reference representation of a design; loading a compared representation of the design, simulating the reference representation to generate first waveform signals and first measured results; simulating the compared representation to generate second waveform signals and second measured results; comparing that the first waveform signals and second waveform signals to identify waveform signals; and comparing that the first measured results and the second measured results to identify second measured result violations. The reference and compared representations are intended to respond to stimulus in a same way. The reference representation is at a different level of abstraction than the compared representation.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It being understood that various changes may be made in the function and arrangement of elements without departing from the spirit and scope as set forth in the appended claims.

Figure 1A:
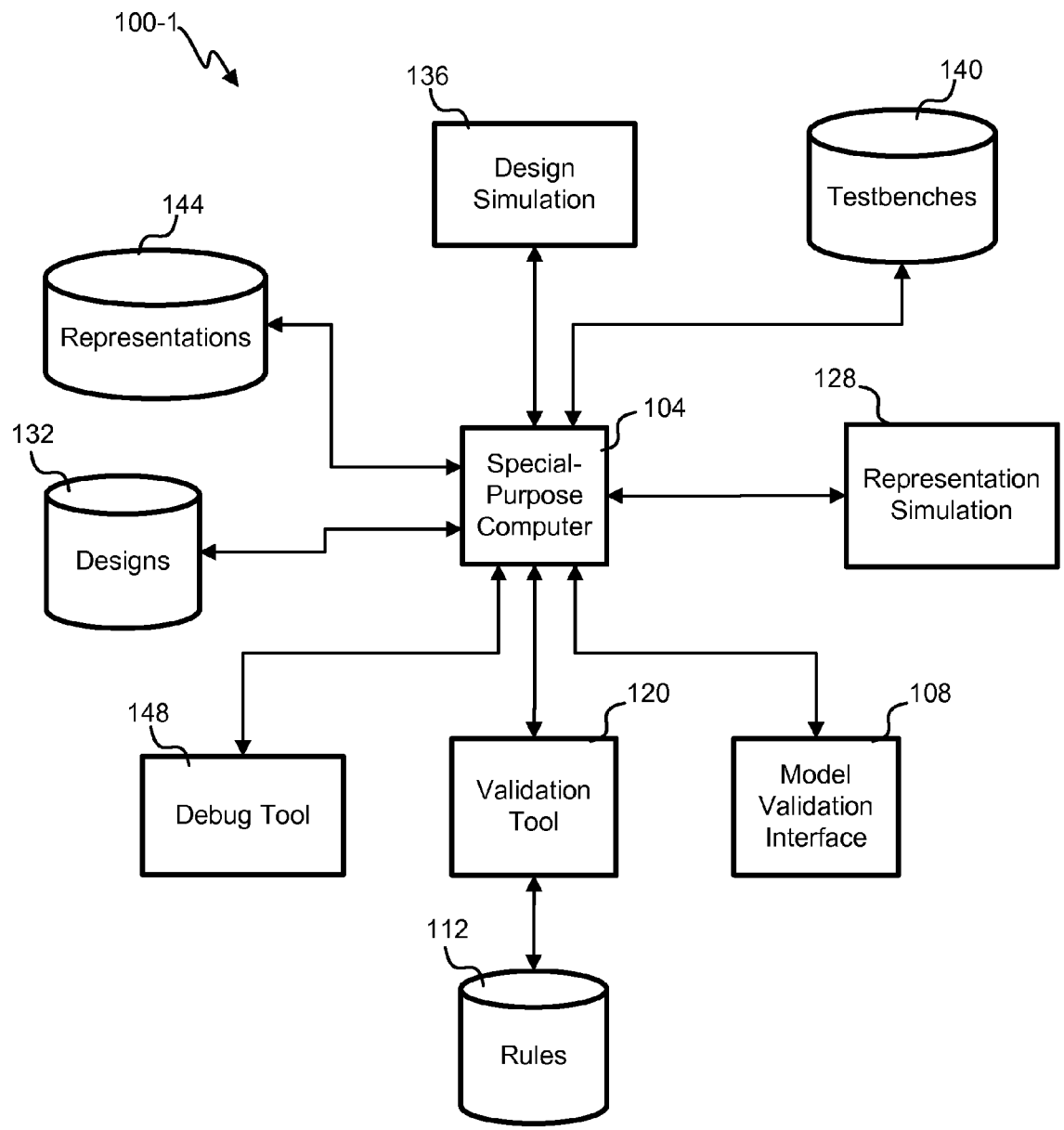
FIGS. 1A and 1B depict block diagrams of embodiments of a validation system.

Referring first to FIG. 1A, a block diagram of an embodiment of a validation system 100-1 is shown. Designs are created with electronic design automation (EDA) tools run with a special-purpose computer 104. These EDA tools are from one or more vendors to support a particular design flow. There could be a suite of EDA tools from one vendor and a backend tool from a vendor that will build the design or provide programmable chips to implement the design. The validation system 100-1 is part of a larger suite of EDA tools used to create the design.

This embodiment has designs 132 that could be at the transistor level and representations 144 for some or all of those designs. The design is built in stages in a top-down and/or bottom-up fashion with modules or sub-designs that could be represented as a transistor level designs and/or behavioral representations, for example. A behavioral representation could be functionally equivalent to a transistor level design for a particular sub-design, but the behavioral representation is at a higher level of abstraction than the transistor level design. Different designers or teams of designers may work separately on the various sub-designs. Simulation may be done with any combination of representations or designs.

A validation tool 120 is accessible from a validation interface 108 and serves as a cockpit to validate representations of the design. A single sub-design, groups of sub-designs or the entire design can be checked by the validation tool 120. Each sub-design can have a reference representation and a compared representation. The validation tool 120 automatically compares the reference to the compared to confirm that module and pin interfaces, measured results and waveform signals match.

Any two representation or designs can be compared in the validation tool 120. For example, a Verilog representation could be compared with a VHDL representation. Typically, a transistor level design will have a behavioral representation to allow for quicker simulation using the behavioral representation. Should either the transistor level design or the behavioral representation change its functionality out of synchronization with changes in the other, the validation tool 120 would find the error. For example, an additional pin could be added to the transistor level design and the validation tool 120 would note that the pin was not found on the behavioral representation.

Using the validation interface 108, a designer can configure the validation tool 120. The two or more representations to validate are specified along with the testbench(es) 140. Rules 112 for the measured results and waveform signals are specified through the validation interface 108. Absolute and relative tolerances are specified for various waveform signals and/or measured results in the rules 112. A signal could have an assertion rule that specifies a hold time of 5 ns or could have the rule specified as having a hold time of 5% of the clock cycle. An absolute tolerance rule could be used to compare the differences between two measured values to a constant number. A relative tolerance rule is specified as a percentage of match between the reference waveform signal or measured result.

Where there is a violation, reports are generated by the validation tool 120 and made viewable in the validation interface 108. The reports identify the pins, nodes, signals, etc. that violate a rule or otherwise don't match the other representation. Each violation in the log can be activated to link to a debug tool 148 with more information. For measured results violations, the debug tool gives detailed information on the rule and how it was violated. With waveform signal violations, the violation in the log can be activated to open the debug tool 148 and show the reference and compared waveform signals side-by-side with one above or on top of the other aligned in time. Additionally, the link can bring the designer to an editing tool for the representation or design to allow fixing the problem.

The validation tool 120 can be manually activated or automatically according to a schedule or at a specified time. For example, the validation tool 120 could run every night in a batch mode. The validation tool 120 activates the design simulator 136 to test the reference design according to the testbench(es) 140 and gathers the reference measured results. Similarly, the compared representation is tested in the representation simulator 128 according to the testbench(es) to gather compared measured results. The validation tool 120 checks that the pins match between the representations and also compares the results from simulation.

Figure 1B:
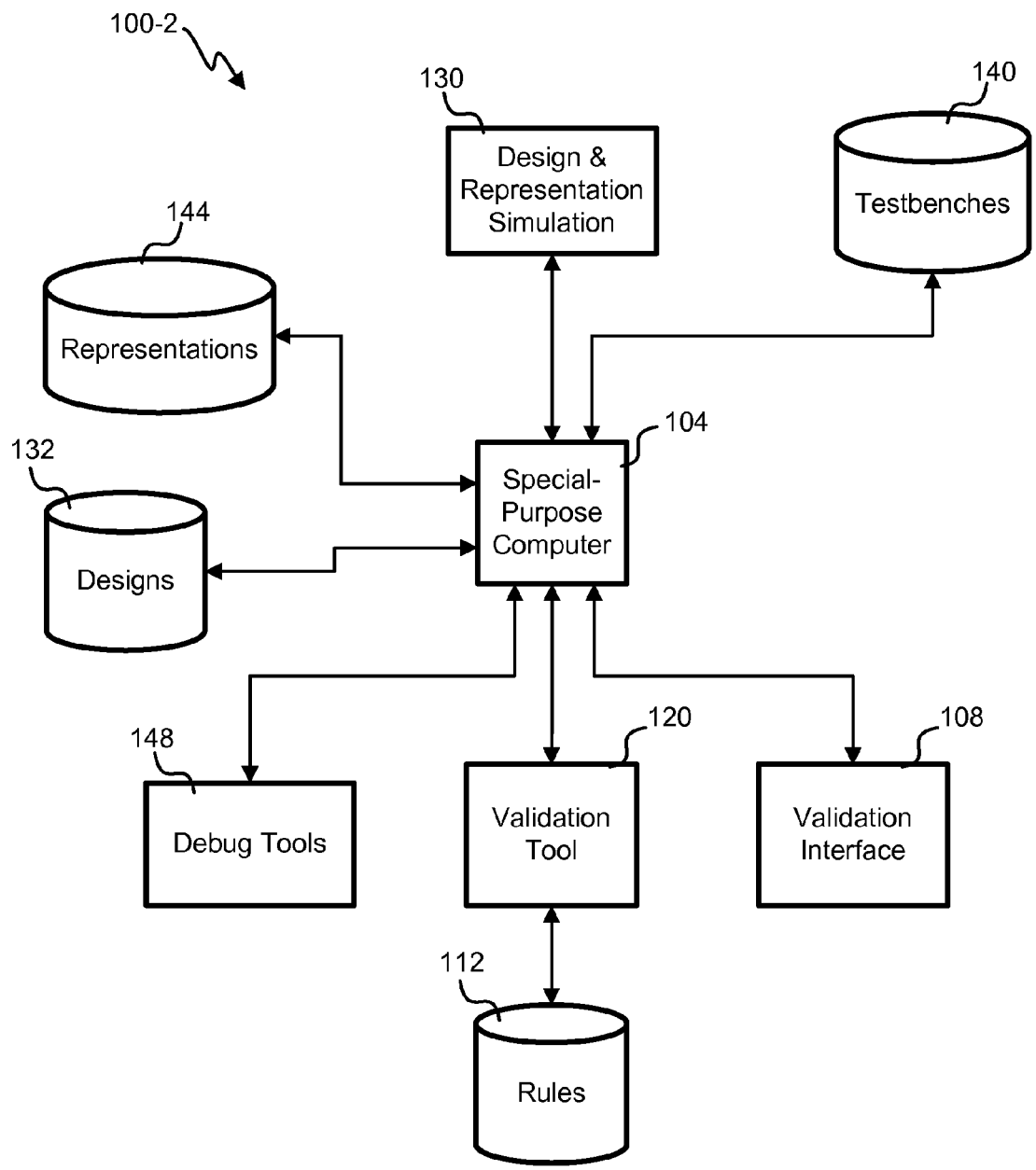

With reference to FIG. 1B, a block diagram of another embodiment of a validation system 100-2 is shown. This embodiment tests both representations with the same simulator 130 that is capable of operating on both the reference and compared representations of the design. For example, a VerilogA and a VerilogAMS representation could be compared by the validation tool. The design and representation simulator 130 could test the representations in series or parallel. In any event, the pin assignments along with their ordering and type, waveform signals and measured results are gathered and compared. It is noted that the pins or internal nets need not have exactly the same names as different names can be aliased to indicate equivalence by the designer using the validation interface 108 in some embodiments.

Figure 2A:
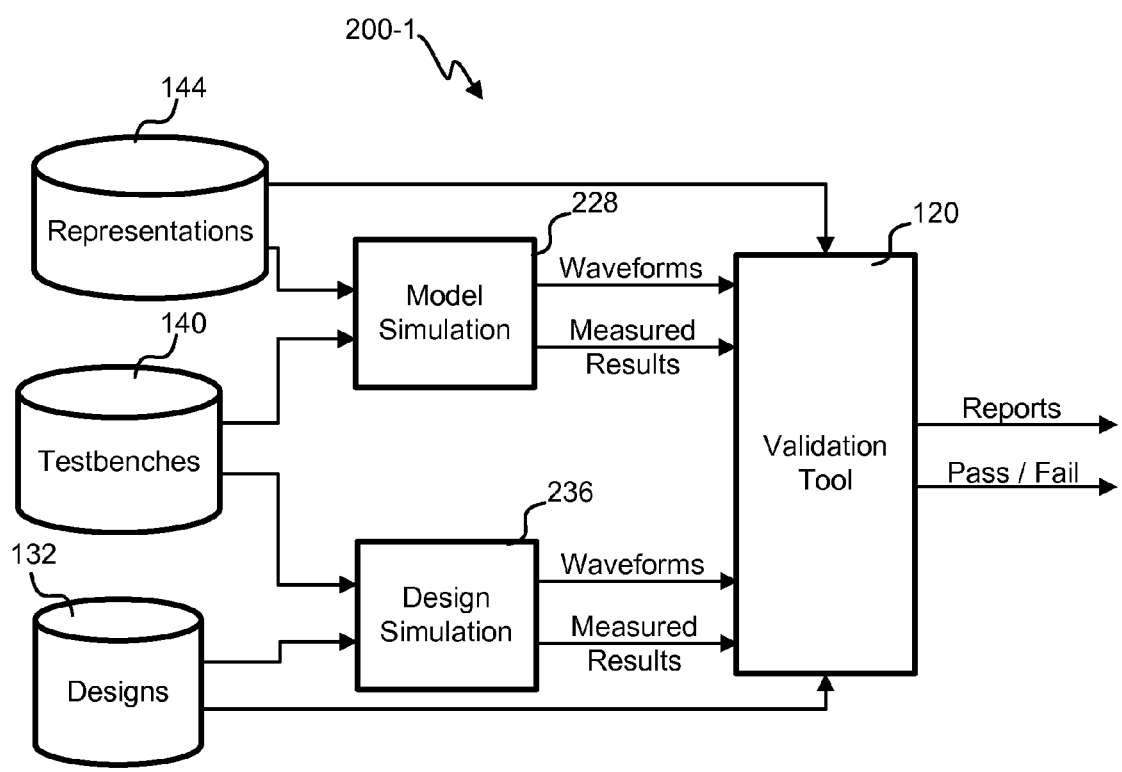
FIGS. 2A and 2B depict block diagrams of embodiment of a validation data flow.

With reference to FIG. 2A, a block diagram of an embodiment of a validation data flow 200-1 is shown. The validation tool 120 when configured by the designer automatically performs the validation data flow 200-1. The validation tool 120 could perform the validation data flow 200-1 a number of times for many sub-designs at a predetermined time or upon activation by the designer. Pass/fail information along with reports are generated by the validation tool 120 for presenting in the validation interface 108.

Several checks are performed by the validation tool 120 in this embodiment. The validation tool checks that the pin names, type and ordering match between the representation 144 and design 132 and reports any failures. The representation 144 is tested in the representation simulation 228, and the design 132 is tested in the design simulation 236 according to the testbench 140. Both waveform signals and measured results are passed from each of the representation and design simulation 228, 236 to the validation tool. The rules 112 are used to determine when there isn't sufficient match between the reference design 132 and compared representation 144.

Figure 2B:
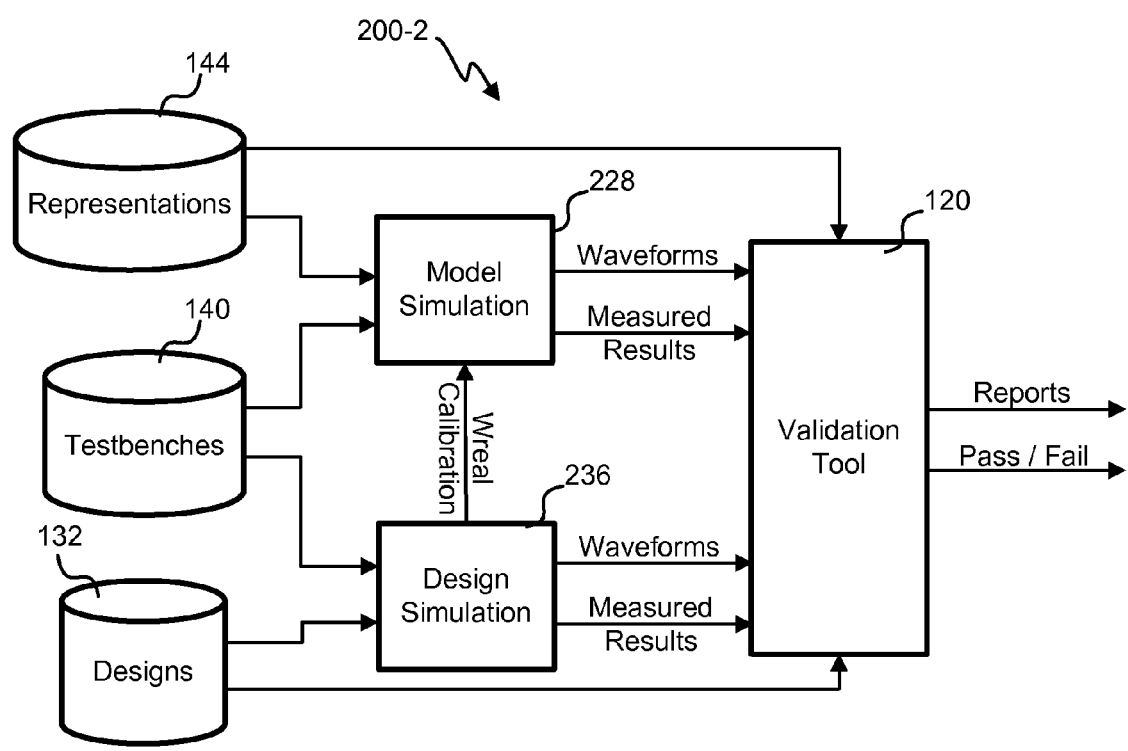

Referring to FIG. 2B, a block diagram of another embodiment of a validation dataflow 200-2 is shown. In this embodiment, there is real number ("Wreal") calibration information created in the design simulation 236 and through a transformation or other processing passed to the representation simulation 228. Wreal calibration information is a subset of Verilog-AMS and improves the accuracy of the representation 144 with measured results from simulation of the transistor level design in the design simulation 236. The Wreal calibration information could be in the form of a lookup table or a database in various embodiments. Operation of the behavioral representations using the Wreal calibration information is checked by the validation tool 120 in this embodiment. Validation between any simulate-able abstractions/representations can be done in design formats that include, but are not limited to, transistor level, Wreal, Verilog-AMS, SystemVerilog models in dflI, VHDL models in dflI, VHDL-AMS models in dflI and/or Verilog-AMS models in dflI.

Figure 3:
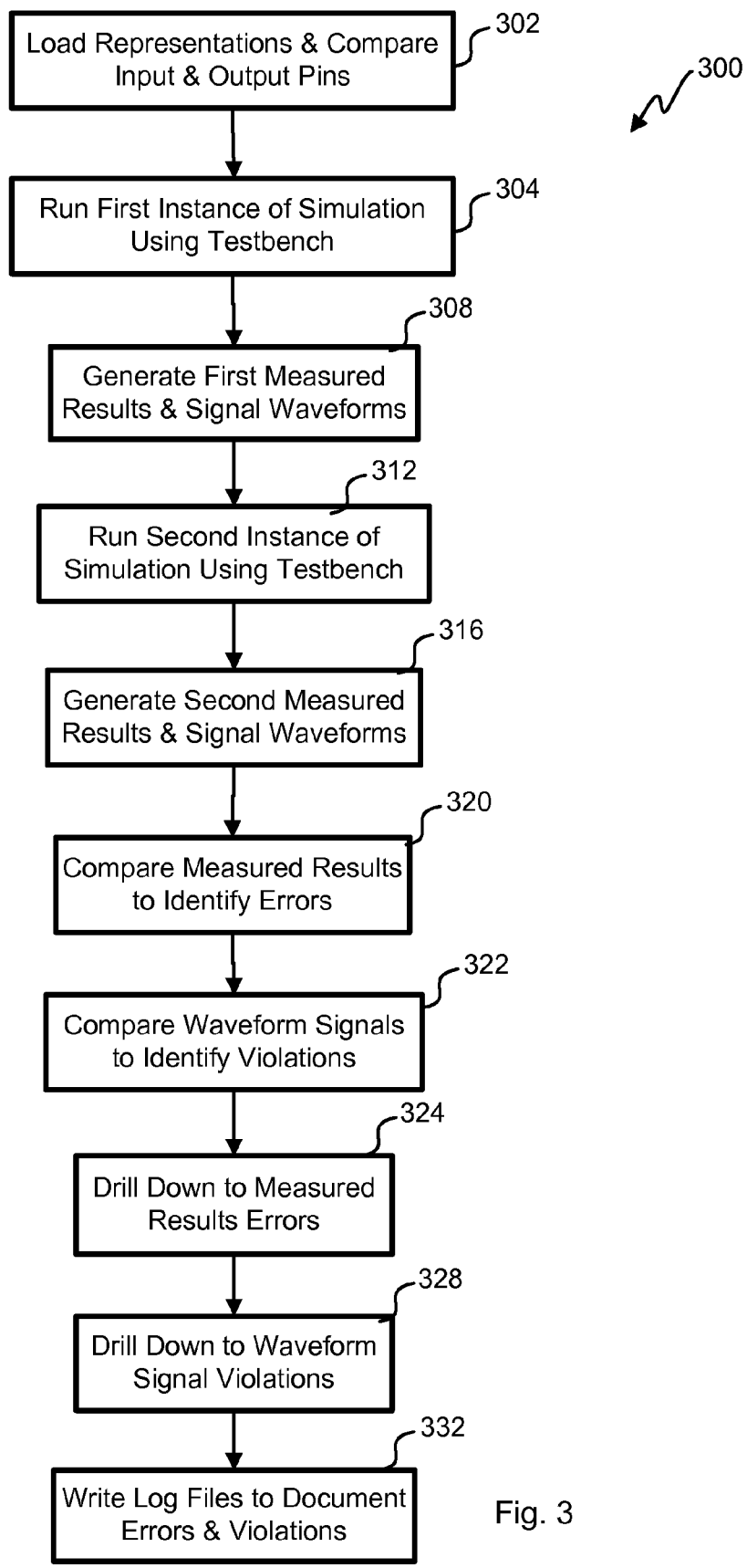
FIG. 3 illustrates a flowchart of an embodiment of a process for comparing simulation instances of a representation of a design.

Referring next to FIG. 3, a flowchart of an embodiment of a process 300 for comparing simulation instances of representations of a design is shown. The designer configures the testbench(es) 140, representation(s) 144, design(s) 132, rule (s) 112, simulations 228, 236 using the validation interface 108 prior to manual or automatic activation of the process 300. The depicted portion of the process 300 begins in block 302, where the representations of the design are loaded and checked for consistency in the pins and their names, ordering and type. For example, the representation 144 should have one-to-one pin correspondence with the design 132 in type, name and ordering.

In block 304, the validation tool 120 runs a first instance of simulation using the testbench 140, for example, the transistor level design could be run with the design simulation 236. Measured results and waveform signals are generated by the design simulation 236 in block 308. The second instance of simulation is run with the testbench 140 in block 304. The two simulation instances in block 304 and 312 can be separate runs on the same simulator or different simulators as specified by the designer. The second simulation instance generates measured results and waveform signals in block 316.

The validation tool 120 compares the measured results from the two simulation instances in block 320 and any errors are identified and reported. The waveform signals from the two simulation runs are compared in block 322 to identify any violations. The validation interface 108 can be used by the designer to investigate measured result errors in block 324 and waveform signal violations in block 328. This could include inspecting more detailed analysis of errors or waveform graphs with the debug tool 148 (shown in FIGS. 1A and 1B). If not already done at this point in the process 300, the result from validation with any errors and violations are written to log files in block 332.

In blocks 304-316, simulation results produce waveform signals and measured results. In some embodiments, the reference or compared representation need not be run each time. The simulation results from a prior simulation can be used in the comparison. For example, a reference representation could be run once to gather simulation results that are used to validate against the simulation of the compared representation. If it remains unchanged, the reference representation need not be simulated again until a change occurs. Other embodiments of the process 300 could check for changes in the reference or compared representations before performing simulation again to use prior simulation results.

Figure 4A:
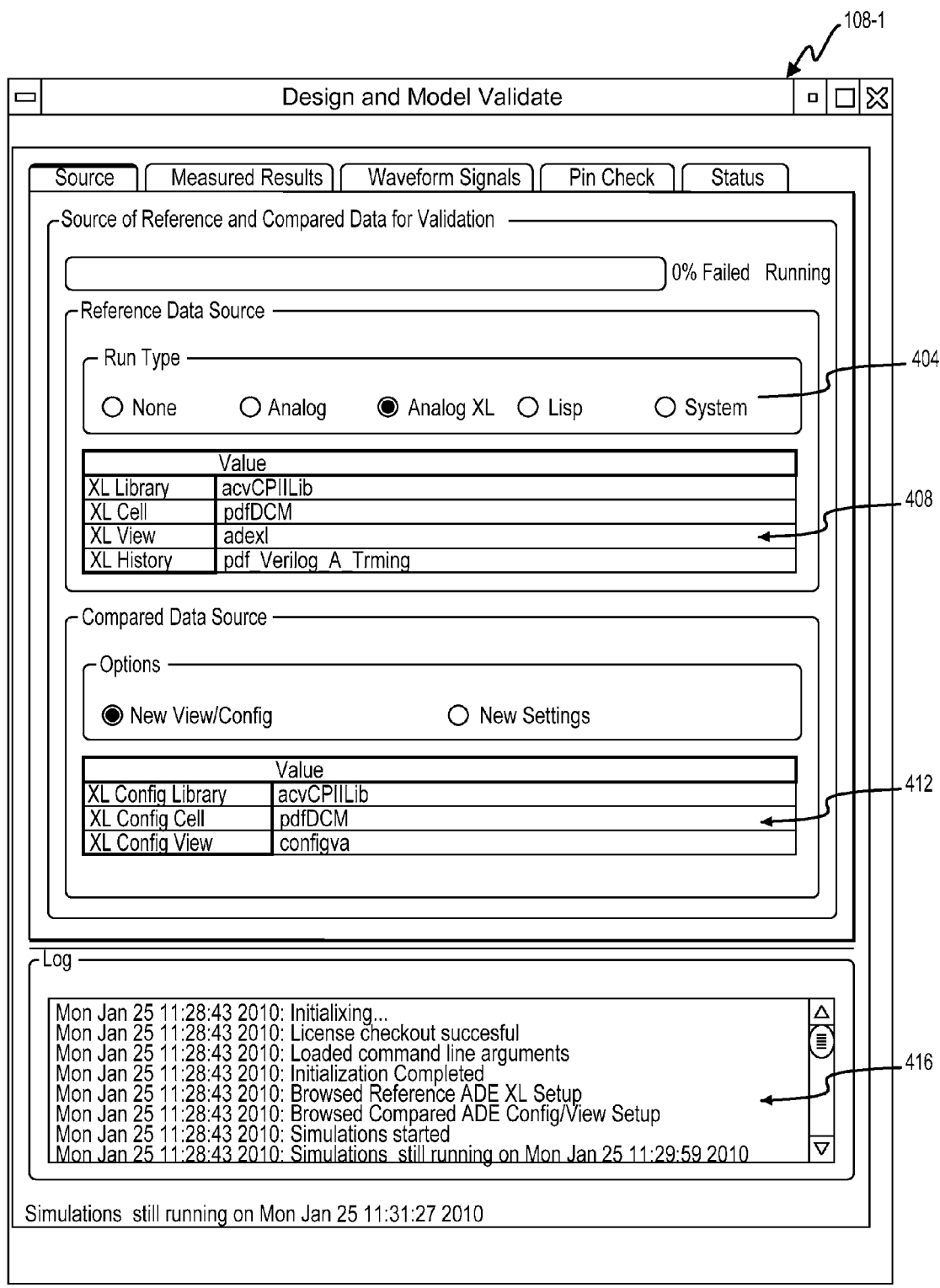
FIGS. 4A, 4B, 4C, 4D, and 4E illustrate screen shots of embodiments of a validation interface to compare simulation instances.

With reference to FIG. 4A, FIG. 4B, FIG. 4C, FIG. 4D, and FIG. 4E, screen shots of embodiments of a validation interface 108 to compared simulation instances are illustrated. In this embodiment, the Analog XL or other simulation tool is selected as the run type 404 from a number of different simulators as shown in FIG. 4A. Although this example of the validation interface is shown using tools available from a particular vendor, it is to be understood that any tools could be used from one or more vendors. The reference data source 408 for the design 132 is also specified. The compared data source 412 for the representation 144 is also specified. The validation tool 120 is running in this example and the log information shows the current status and history of the run.

Figure 4B:
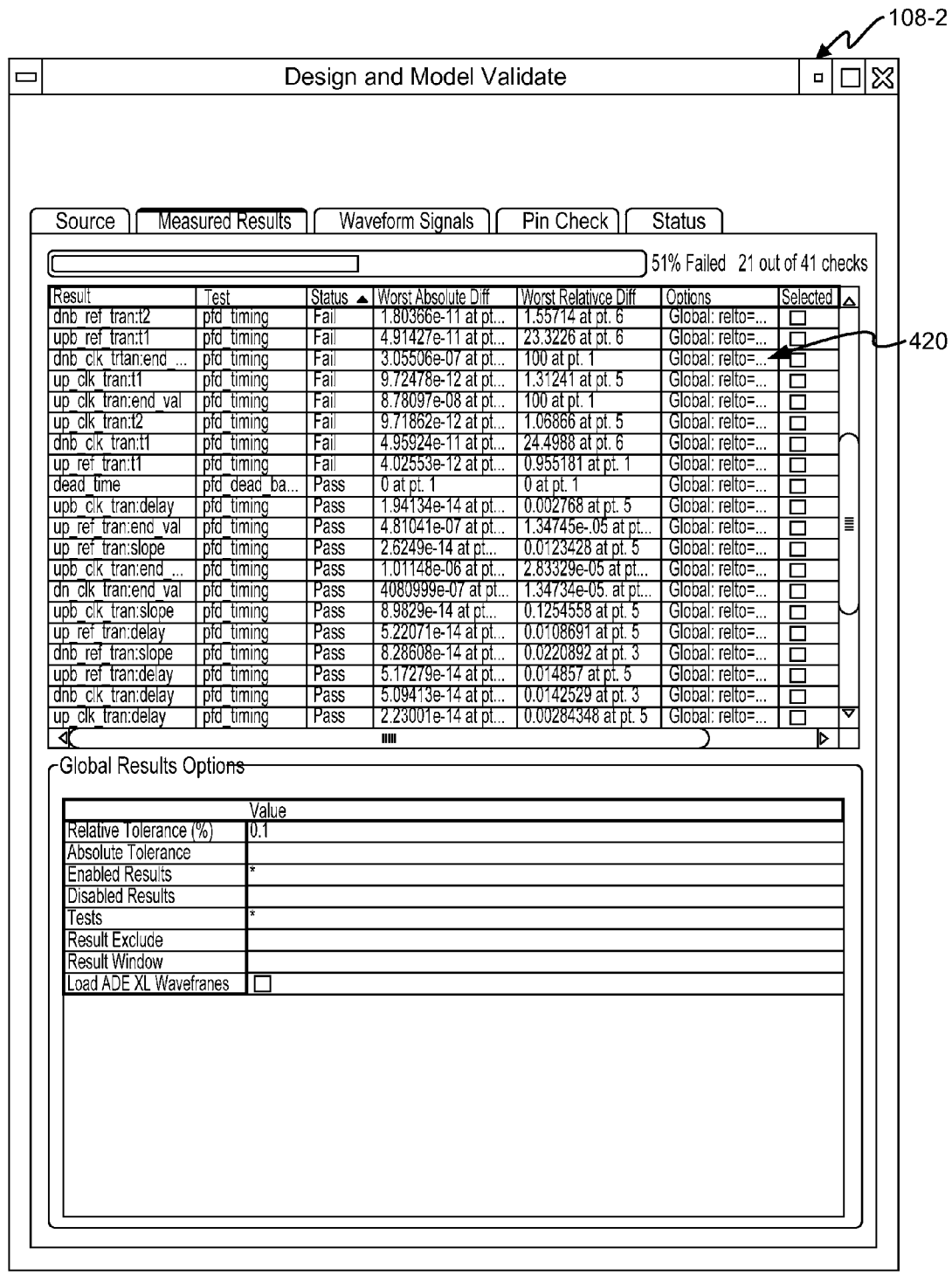

With reference to the screen shot in FIG. 4B, a measured results portion of the validation interface 108 is shown. In this example, results section 420 shows twenty-one of forty-one check failed. Brief details are shown for each check that passes and the errors upon failure. The failures can be selected to link to additional information on the failure.

Figure 4C:
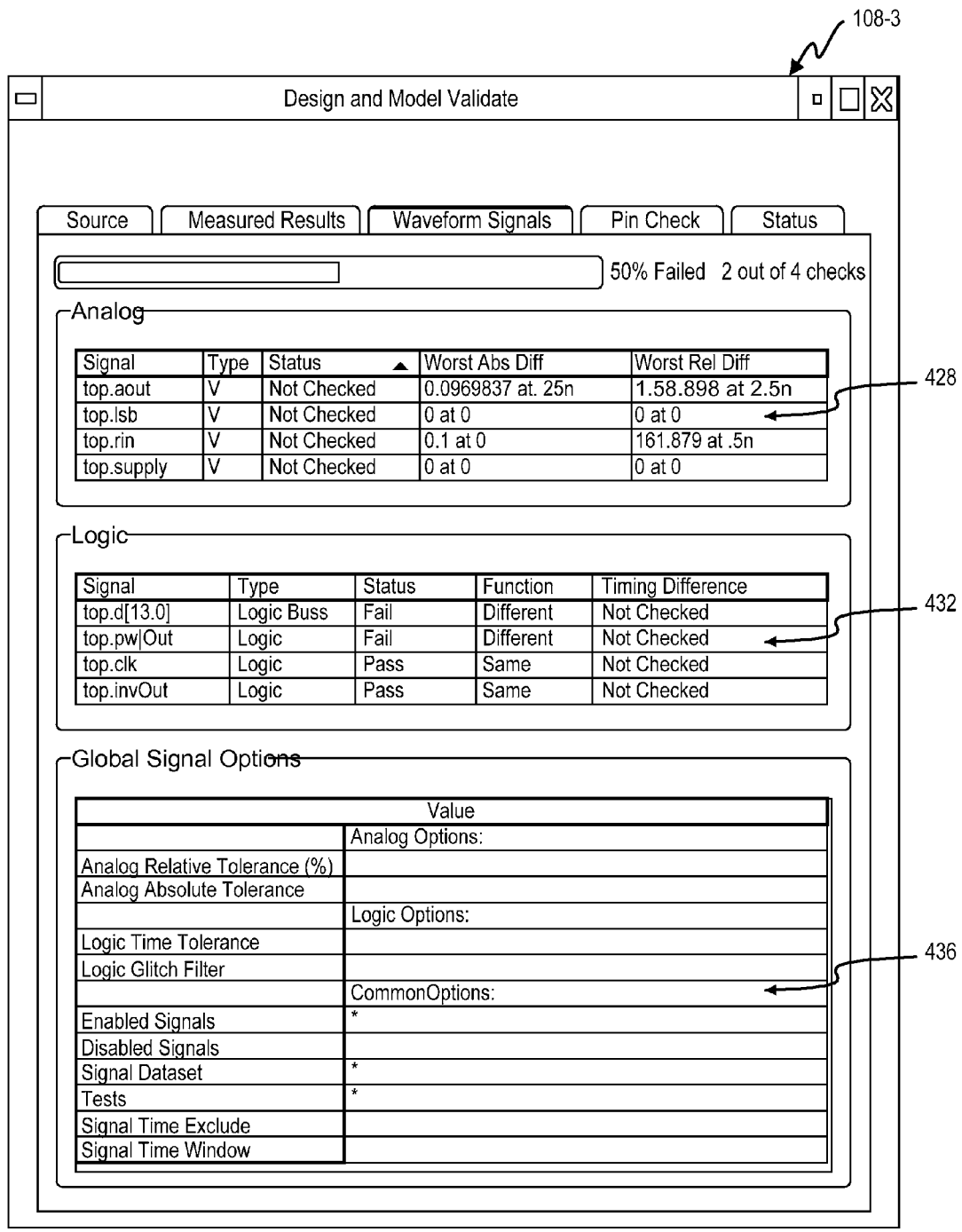

Referring next to the screen shot in FIG. 4C, a waveform signals portion of the validation interface 108 is shown. Signals are checked in an analog and digital sense. An analog portion 428 shows results for any enabled analog checks as defined in the rules 112. A logic portion 432 shows any logic failures from the run. Violations and errors can be selected to activate the debug tool 148 to show the reference and compared waveform signals side-by-side with one waveform signal above the other and both aligned in time. In a global signal options section 436, the designer can specify relative and absolute tolerances as analog checks and time tolerances and glitch filters for logic tests. Individual signals can be disabled or enabled from global testing for the entire run or during select windows of time. Through manipulation of the global signal options section 436, the user can control the built in rules of the validation tool 120. These options define what is to be validated, not validated and the acceptable deviations.

Figure 4D:
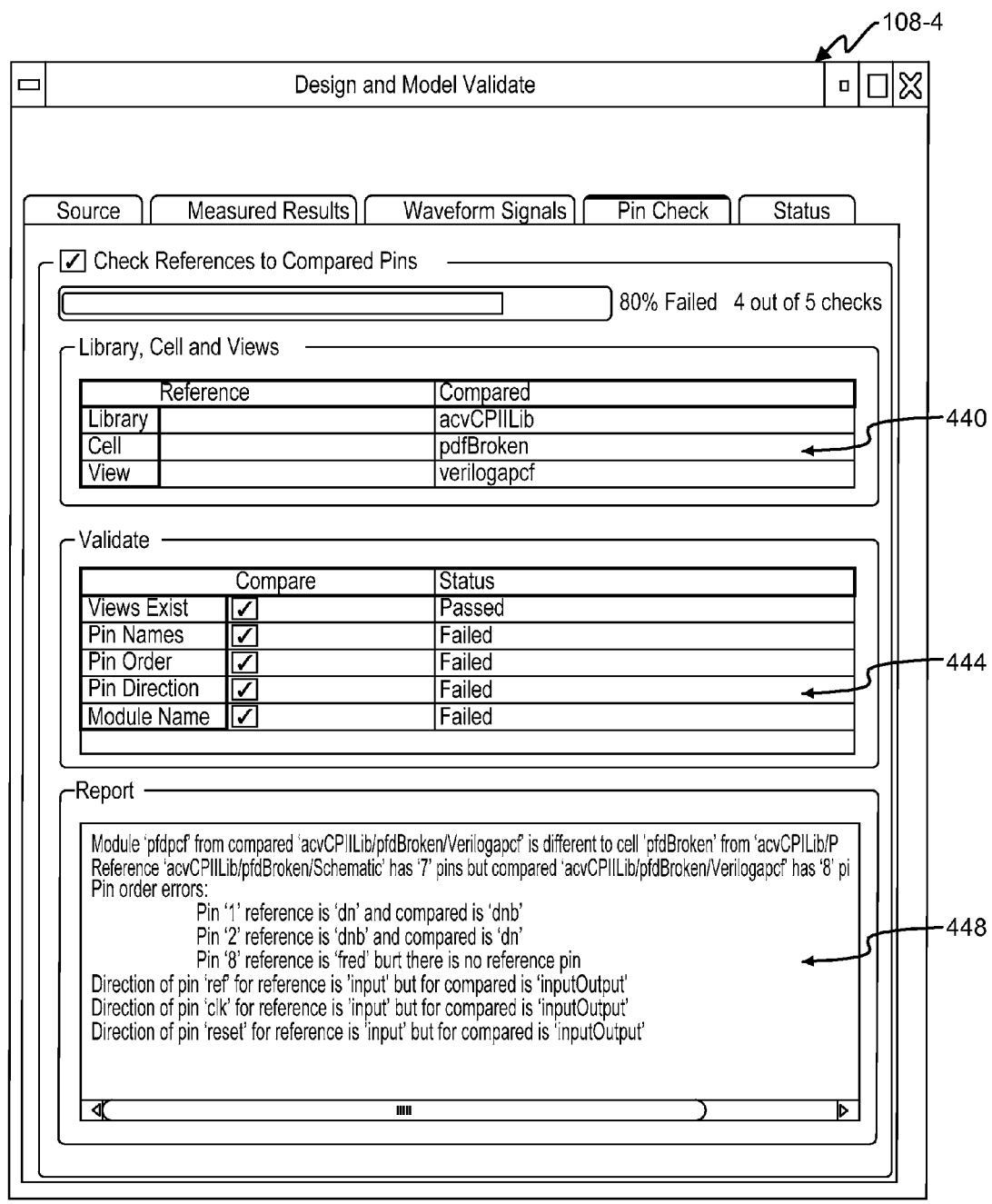
Figure 4E:
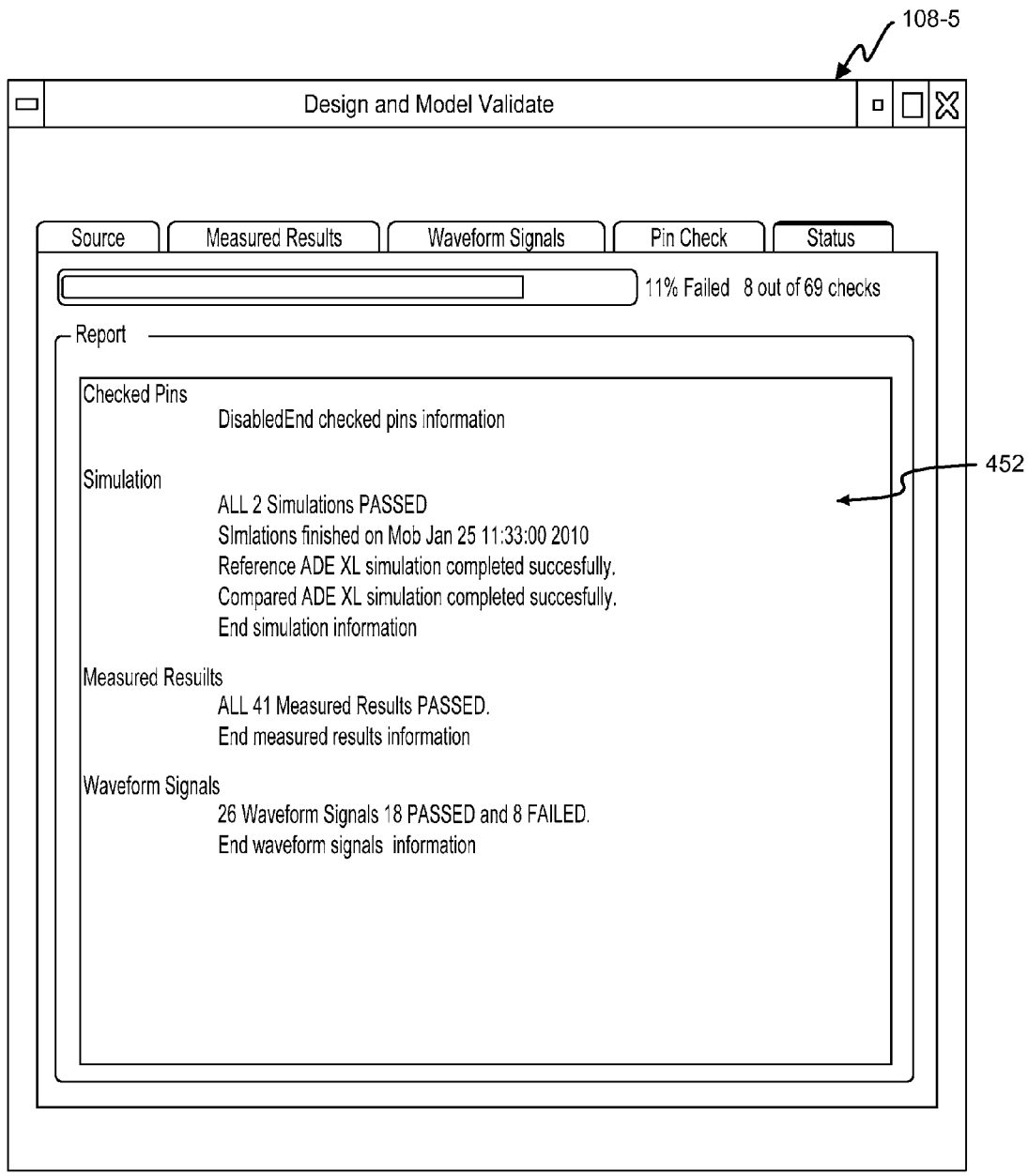

With reference to the screen shot in FIG. 4D, a pin check portion of the validation interface 108 is shown. The library, cell and views section 440 specifies the reference and compared representations that are being checked for consistent pin configurations. The validation section 444 allows selection of the tests to perform and gives the results of those tests. A report section 448 gives more specific information on the results from the validation. An overall report for the validation tool 120 is shown in a report section 452 in FIG. 4E.

Figure 5:
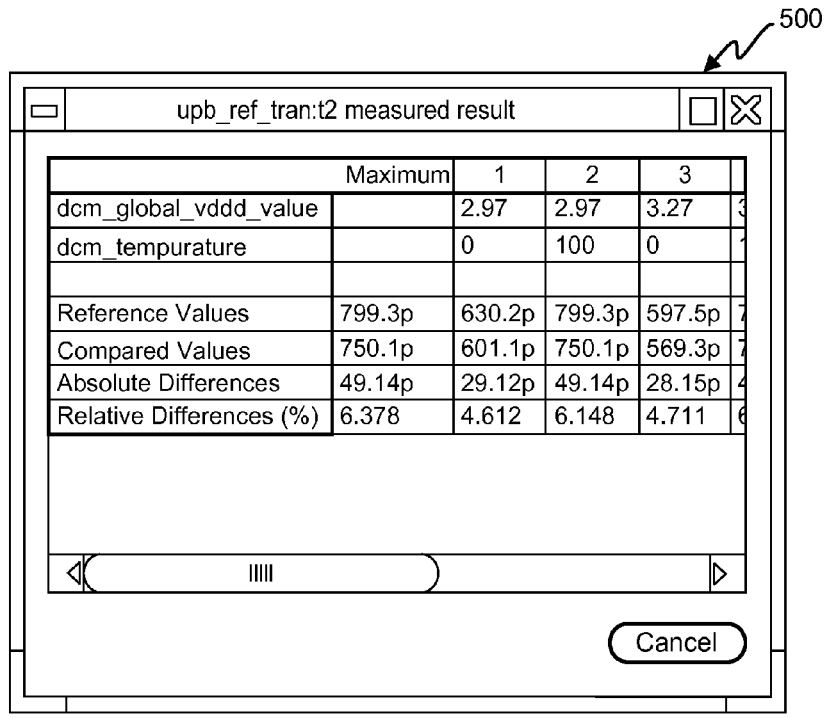
FIG. 5 illustrates a screen shot of an embodiment of a window that shows a signal error.
Figure 6:
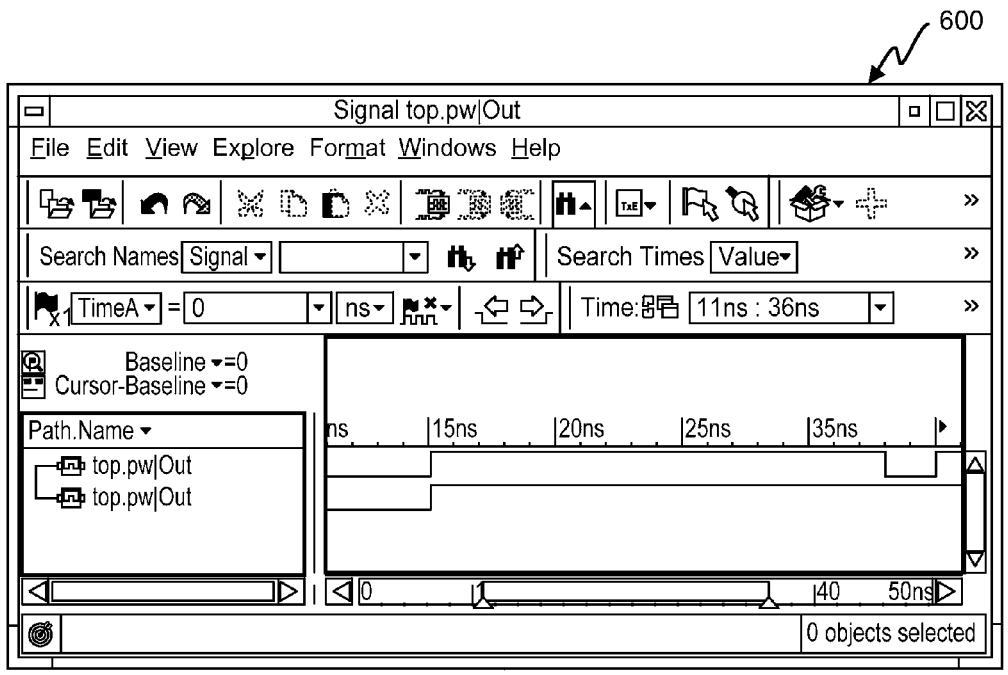
FIG. 6 illustrates a screen shot of an embodiment of a window that shows a signal violation.

The debug tool 148 (shown in FIGS. 1A and 1B) gives the designer additional information for errors and violations found by the validation tool 120 and presented in the validation interface 108. Referring next to FIG. 5, a screen shot of an embodiment of a error window 500 is presented to show a signal error. Both absolute differences and relative differences are shown. With reference to FIG. 6, a screen shot of an embodiment of a timing window 600 is presented to show a signal violation. Reference and compared versions of a signal from the simulation is shown. A glitch is shown in the top waveform signal 33-35 ns into the simulation. The signal names on the left are linked to design editing tools that would highlight the signal when activated.

Figure 7:
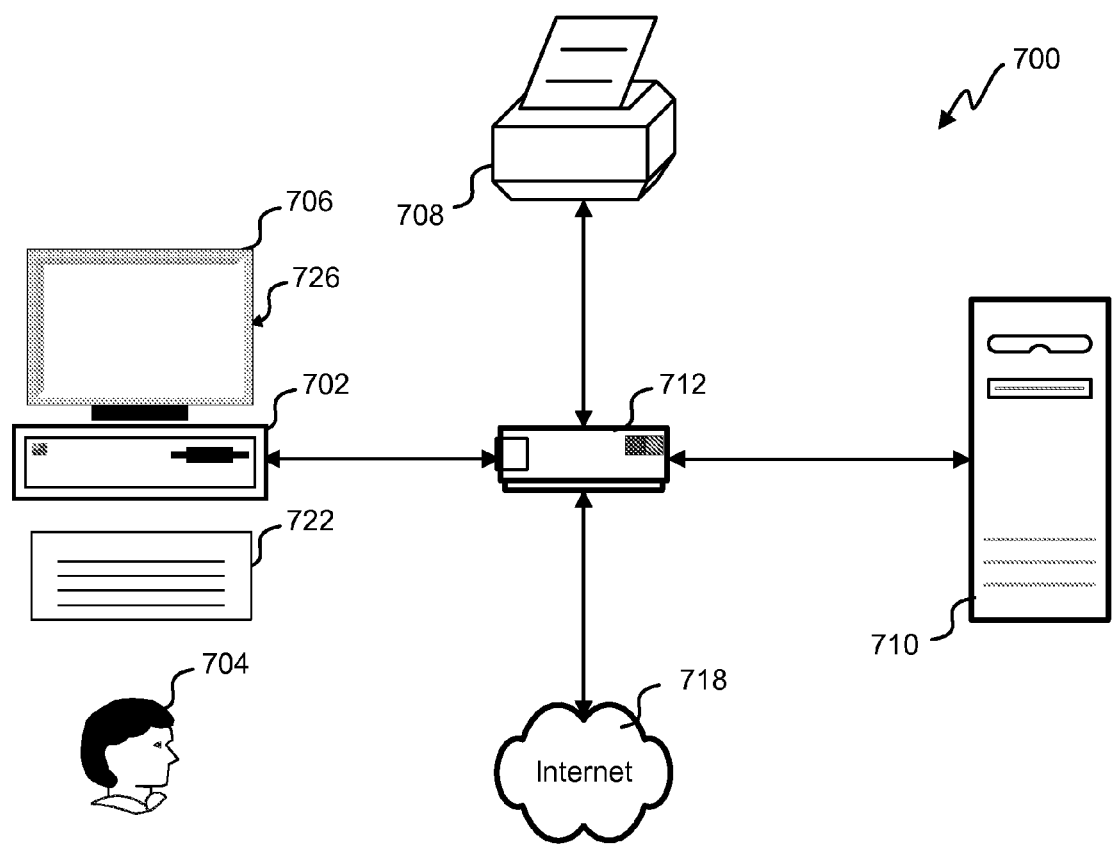
FIG. 7 depicts a block diagram of an embodiment of a EDA system.

Referring next to FIG. 7, an exemplary environment with which embodiments may be implemented is shown with a EDA system 700 that can be used by a designer 704 to design, for example, electronic designs. The EDA system 700 can include a computer 702, keyboard 722, a network router 712, a printer 708, and a monitor 706. The monitor 706, processor 702 and keyboard 722 are part of a computer system 726, which can be a laptop computer, desktop computer, handheld computer, mainframe computer, etc. The monitor 706 can be a CRT, flat screen, etc.

A designer 704 can input commands into the computer 702 using various input devices, such as a mouse, keyboard 722, track ball, touch screen, etc. If the EDA system 700 comprises a mainframe, a designer 704 can access the computer 702 using, for example, a terminal or terminal interface. Additionally, the computer system 726 may be connected to a printer 708 and a server 710 using a network router 712, which may connect to the Internet 718 or a WAN.

The server 710 may, for example, be used to store additional software programs and data. In one embodiment, software implementing the systems and methods described herein can be stored on a storage medium in the server 710. Thus, the software can be run from the storage medium in the server 710. In another embodiment, software implementing the systems and methods described herein can be stored on a storage medium in the computer 702. Thus, the software can be run from the storage medium in the computer system 726. Therefore, in this embodiment, the software can be used whether or not computer 702 is connected to network router 712. Printer 708 may be connected directly to computer 702, in which case, the computer system 726 can print whether or not it is connected to network router 712.

Figure 8:
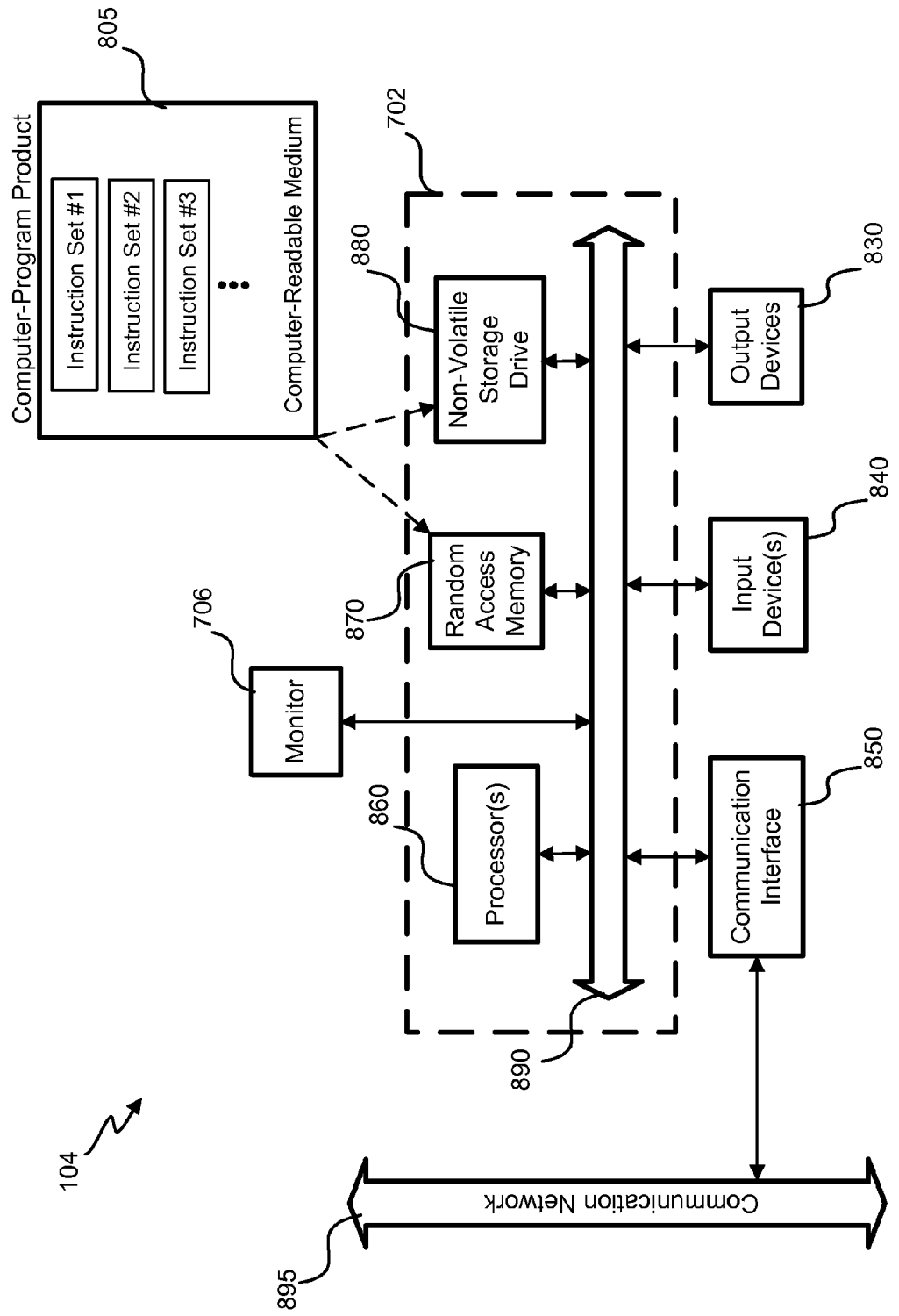
FIG. 8 depicts a block diagram of an embodiment of a special-purpose computer system.

With reference to FIG. 8, an embodiment of a special-purpose computer system 104 is shown. The above methods may be implemented by computer-program products that direct a computer system to perform the actions of the above-described methods and components. Each such computer-program product may comprise sets of instructions (codes) embodied on a computer-readable medium that directs the processor of a computer system to perform corresponding actions. The instructions may be configured to run in sequential order, or in parallel (such as under different processing threads), or in a combination thereof. After loading the computer-program products on a general purpose computer system 726, it is transformed into the special-purpose computer system 104 to perform EDA.

Special-purpose computer system 104 comprises a computer 702, a monitor 706 coupled to computer 702, one or more additional user output devices 830 (optional) coupled to computer 702, one or more user input devices 840 (e.g., keyboard, mouse, track ball, touch screen) coupled to computer 702, an optional communications interface 850 coupled to computer 702, a computer-program product 805 stored in a tangible computer-readable memory in computer 702. Computer-program product 805 directs system 104 to perform the above-described methods. Computer 702 may include one or more processors 860 that communicate with a number of peripheral devices via a bus subsystem 890. These peripheral devices may include user output device(s) 830, user input device(s) 840, communications interface 850, and a storage subsystem, such as random access memory (RAM) 870 and non-volatile storage drive 880 (e.g., disk drive, optical drive, solid state drive), which are forms of tangible computer-readable memory.

Computer-program product 805 may be stored in non-volatile storage drive 880 or another computer-readable medium accessible to computer 702 and loaded into memory 870.

Each processor 860 may comprise a microprocessor, such as a microprocessor from Intel® or Advanced Micro Devices, Inc.®, or the like. To support computer-program product 805, the computer 702 runs an operating system that handles the communications of product 805 with the above-noted components, as well as the communications between the above-noted components in support of the computer-program product 805. Exemplary operating systems include Windows® or the like from Microsoft Corporation, Solaris® from Sun Microsystems, LINUX, UNIX, and the like.

User input devices 840 include all possible types of devices and mechanisms to input information to computer system 702. These may include a keyboard, a keypad, a mouse, a scanner, a digital drawing pad, a touch screen incorporated into the display, audio input devices such as voice recognition systems, microphones, and other types of input devices. In various embodiments, user input devices 840 are typically embodied as a computer mouse, a trackball, a track pad, a joystick, wireless remote, a drawing tablet, a voice command system. User input devices 840 typically allow a user to select objects, icons, text and the like that appear on the monitor 706 via a command such as a click of a button or the like. User output devices 830 include all possible types of devices and mechanisms to output information from computer 702. These may include a display (e.g., monitor 706), printers, non-visual displays such as audio output devices, etc.

Communications interface 850 provides an interface to other communication networks and devices and may serve as an interface to receive data from and transmit data to other systems, WANs and/or the Internet 718. Embodiments of communications interface 850 typically include an Ethernet card, a modem (telephone, satellite, cable, ISDN), a (asynchronous) digital subscriber line (DSL) unit, a FireWire® interface, a USB® interface, a wireless network adapter, and the like. For example, communications interface 850 may be coupled to a computer network, to a FireWire® bus, or the like. In other embodiments, communications interface 850 may be physically integrated on the motherboard of computer 702, and/or may be a software program, or the like.

RAM 870 and non-volatile storage drive 880 are examples of tangible computer-readable media configured to store data such as computer-program product embodiments of the present invention, including executable computer code, human-readable code, or the like. Other types of tangible computer-readable media include floppy disks, removable hard disks, optical storage media such as CD-ROMs, DVDs, bar codes, semiconductor memories such as flash memories, read-only-memories (ROMs), battery-backed volatile memories, networked storage devices, and the like. RAM 870 and non-volatile storage drive 880 may be configured to store the basic programming and data constructs that provide the functionality of various embodiments of the present invention, as described above.

Software instruction sets that provide the functionality of the present invention may be stored in RAM 870 and non-volatile storage drive 880. These instruction sets or code may be executed by the processor(s) 860. RAM 870 and non-volatile storage drive 880 may also provide a repository to store data and data structures used in accordance with the present invention. RAM 870 and non-volatile storage drive 880 may include a number of memories including a main random access memory (RAM) to store of instructions and data during program execution and a read-only memory (ROM) in which fixed instructions are stored. RAM 870 and non-volatile storage drive 880 may include a file storage subsystem providing persistent (non-volatile) storage of program and/or data files. RAM 870 and non-volatile storage drive 880 may also include removable storage systems, such as removable flash memory.

Bus subsystem 890 provides a mechanism to allow the various components and subsystems of computer 702 communicate with each other as intended. Although bus subsystem 890 is shown schematically as a single bus, alternative embodiments of the bus subsystem may utilize multiple busses or communication paths within the computer 702.

A number of variations and modifications of the disclosed embodiments can also be used. For example, an existing transistor level design could be encapsulated, verified and characterized to create one of the design representations. Wreal calibration information from the existing transistor level design would be passed along with the created behavioral representation used in simulation. Indeed, during the evolution of a design, there may be many new transistor level versions of a transistor level design and the validation tool could be used to validate that the transistor level design matches the design representation with updated Wreal calibration information.

Specific details are given in the above description to provide a thorough understanding of the embodiments. However, it is understood that the embodiments may be practiced without these specific details. For example, designs may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks may be stored in a machine readable medium such as a storage medium. A code segment or machine-executable instruction may represent a procedure, a function, a subprogram, a program, a routine, a subroutine, a module, a software package, a script, a class, or any combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted via any suitable means including memory sharing, message passing, token passing, network transmission, etc.

Moreover, as disclosed herein, the term "storage medium" may represent one or more memories for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels, and/or various other storage mediums capable of storing that contain or carry instruction(s) and/or data.

While the principles of the disclosure have been described above in connection with specific apparatuses and methods, it is to be clearly understood that this description is made only by way of example and not as limitation on the scope of the disclosure.

What is claimed is:

1. A computer-implemented method for validating different design representations, the method comprising:
    loading a reference representation of a design;
    loading a compared representation of the design, wherein:
        the reference and compared representations are intended to respond to stimulus in the same way, and
        the reference representation is at a different level of abstraction than the compared representation;
    simulating, using one or more processors, the reference representation to generate first waveform signals and first measured results;
    simulating, using the one or more processors, the compared representation to generate second waveform signals and second measured results;
    comparing, using the one or more processors, the first waveform signals and second waveform signals to identify waveform signal violations; and
    comparing, using the one or more processors, the first measured results and the second measured results to identify measured result violations.

2. The computer-implemented method as recited in claim 1, further comprising:
    displaying a signal name of one of the waveform signal violations; and
    linking the signal name to a new window with details on the one.

3. The computer-implemented method as recited in claim 2, wherein:
    the new window displays a first waveform signal corresponding to the signal name in the first simulation instance, and
    the new window displays a second waveform signal corresponding to the signal name in the second simulation instance.

4. The computer-implemented method as recited in claim 1, wherein the simulations are performed by a same simulation tool.

5. The computer-implemented method as recited in claim 1, wherein the simulations are performed by different simulation tools.

6. The computer-implemented method as recited in claim 1, wherein loading, simulation and comparing are automatically run periodically by a validation tool.

7. A system for validating design representations, the EDA system comprising:
    a non-transitory storage medium;
    one or more processors coupled to said non-transitory storage medium;
    wherein said storage medium comprises data representing:
    a reference representation of a design;
    a compared representation of the design, wherein:
        the reference and compared representations are intended to respond to stimulus in a same way, and
        the reference representation is at a different level of abstraction than the compared representation;
    a first simulation instance configured to generate first waveform signals and first measured results with the reference representation;
    a second simulation instance configured to generate second waveform signals and second measured results with the compared representation; and wherein said one or more processors are configured to perform a design representation validation function configured to:
compare the first waveform signals and second waveform signals to identify waveform signal violations, and
compare the first measured results and the second measured results to identify measured result violations.

8. The system recited in claim 7, further comprising a design representation validation interface, wherein the design representation validation interface:
displays a signal name with one of the waveform signal violations, and
allows selection of the signal name to present a new window with details on the one.

9. The system as recited in claim 8, wherein:
the new window displays a first waveform signal corresponding to the signal name in the first simulation instance, and
the new window displays a second waveform signal corresponding to the signal name in the second simulation instance.

10. The system as recited in claim 7, wherein the first simulator is not designed to simulate the second representation.

11. The system as recited in claim 7, wherein the first simulation instance and the second simulation instance are from a same simulation tool.

12. The system to validate design representations as recited in claim 7, wherein:
the first simulation instance is from a first simulation tool, and
the second simulation instance is from a second simulation tool.

13. The system as recited in claim 7, wherein the design representation validation function is configured to automatically run periodically.

14. The system as recited in claim 7, wherein the design representation validation function generates a report indicating failures in comparison.

15. A non-transitory computer-readable storage medium comprising computer code stored in said storage medium, wherein said computer code, when retrieved from said storage medium and executed by a processor, results in:
loading a reference representation of a design;
loading a compared representation of the design, wherein:
the reference and compared representations are intended to respond to stimulus in a same way, and
the reference representation is at a different level of abstraction than the compared representation;
simulating the reference representation to generate first waveform signals and first measured results;
simulating the compared representation to generate second waveform signals and second measured results;
comparing that the first waveform signals and second waveform signals to identify waveform signals; and
comparing that the first measured results and the second measured results to identify second measured result violations.

16. The non-transitory computer-readable storage medium as recited in claim 15, further comprising code for:
displaying a signal name with one of the waveform signal violations; and
linking the signal name to a new window with details on the one.

17. The non-transitory computer-readable storage medium as recited in claim 16, wherein:
the new window displays a first waveform signal corresponding to the signal name in the first simulation instance, and
the new window displays a second waveform signal corresponding to the signal name in the second simulation instance.

18. The non-transitory computer-readable storage medium as recited in claim 15, wherein the simulations are performed by a same simulation tool.

19. The non-transitory computer-readable storage medium as recited in claim 15, wherein the simulations are performed by different simulation tools.

20. The non-transitory computer-readable storage medium as recited in claim 15, wherein the code for loading, simulation and comparing are automatically run periodically by a validation tool.

* * * * *